United States Patent
Kushida et al.

(10) Patent No.: US 8,525,708 B2
(45) Date of Patent: Sep. 3, 2013

(54) DECODING DEVICE AND CODING METHOD

(75) Inventors: Sohei Kushida, Tokyo (JP); Takashi Takemoto, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/607,115

(22) Filed: Sep. 7, 2012

(65) Prior Publication Data
US 2013/0154857 A1 Jun. 20, 2013

(30) Foreign Application Priority Data
Dec. 15, 2011 (JP) ................. P2011-274723

(51) Int. Cl.
*H03M 7/00* (2006.01)

(52) U.S. Cl.
USPC ........................... 341/107; 341/51

(58) Field of Classification Search
USPC ...... 341/107, 51, 60, 63, 65, 67; 375/240.26, 375/240.25, 240.24, 316, 216
See application file for complete search history.

(56) References Cited

U.S. PATENT DOCUMENTS
5,583,500 A * 12/1996 Allen et al. ............ 341/107
2009/0232205 A1 9/2009 Chiba FOREIGN PATENT DOCUMENTS
| JP | 2008-289125 | 11/2008 |
| JP | 2008-311803 | 12/2008 |
| JP | 2009-159366 | 7/2009 |
| JP | 2012-016123 | 1/2012 |

* cited by examiner

*Primary Examiner* — Joseph Lauture
(74) *Attorney, Agent, or Firm* — Patterson & Sheridan, LLP

(57) ABSTRACT

A decoding device has a buffer configured in memory to store N code streams and N decoders connected in series. Each of N decoders decodes a corresponding code steam and sequentially generates partial symbols of M bit width each unit cycle. Among the N decoders, i (i>=2) stage decoders stores multiple probabilistic models in the memory. In each unit cycle, the decoder receives an input of i−1 partial symbols which contains partial symbols generated by the i−1 stage decoder in the former unit cycle, selects one probabilistic model among the multiple probabilistic models based on i−1 partial symbols which are entered previously, generates one partial symbol using previously selected probabilistic models, and outputs the previously generated one partial symbol along with previously entered i−1 partial symbols.

6 Claims, 12 Drawing Sheets

US 8,525,708 B2

DECODING DEVICE AND CODING METHOD

CROSS-REFERENCE TO RELATED APPLICATION

This application is based upon and claims the benefit of priority from Japanese Patent Application No. 2011-274723, filed Dec. 15, 2011; the entire contents of which are incorporated herein by reference.

FIELD

Embodiments described herein relate to a decoding device and coding method.

BACKGROUND

Encoding (arithmetic coding) that uses calculation symbols is recognized as a data compressing method. Arithmetic coding is a technique wherein an input symbol is coded by dividing the interval between 0 and 1, with 0 inclusive, into small intervals proportional to the occurrence probability of the input symbol. According to arithmetic coding, the process in which the small interval specified by an input symbol that is input just before the considered input symbol is divided into smaller intervals proportional to the occurrence probability of the considered input symbol, is sequentially carried out. As a result, multiple input symbols are coded into one real number.

One of the arithmetic coding methods is known as a "Range Coder." According to the Range Coder, it is possible to code into an integer by using an interval greater than 1.

DETAILED DESCRIPTION

In general, embodiments of a decoding device and coding method are explained in detail with reference to the attached figures. However, this invention is not restricted to this embodiment. Disclosed herein is a decoding device according to an embodiment that is integrated in a picture reproducer such as a game machine. The decoding device is not restricted only to a picture reproducer. The decoding device of embodiment can be also applied to devices that can decode coded data.

According to an embodiment, there is provided a decoding device that can decode the code as fast as possible and a coding method that generates a code that can be decoded by the decoding device.

According to the first embodiment, the decoding device includes a buffer that stores N code streams, and multistage N decoders that are connected in series. Each of the N decoders has a corresponding code stream, and one-by-one generates a partial symbol having a width of M bits every unit cycle. Among the N decoders, i (i>=2) stage decoders store multiple probabilistic models in memory. In each unit cycle, the decoder receives an input of i−1 partial symbols which contains partial symbols generated by the i−1 stage decoder in the former unit cycle, further selects one probabilistic model among the multiple probabilistic models based on the i−1 partial symbols which were entered previously, generates one partial symbol using previously selected probabilistic models, and outputs the previously generated one partial symbol along with previously entered i−1 partial symbols.

Embodiment 1

Figure 1:
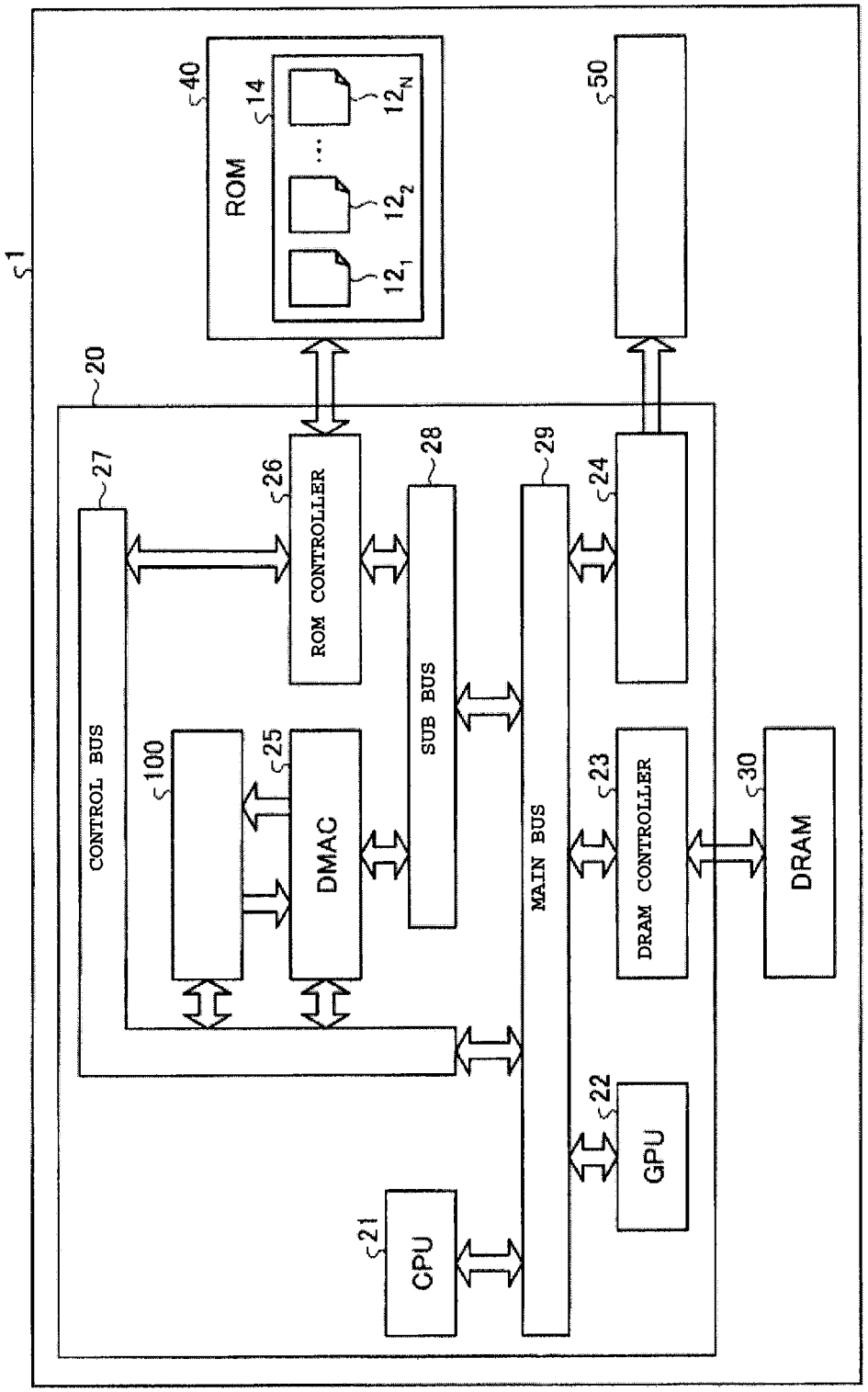
FIG. 1 shows the composition of a picture reproducer provided with a decoding device according to an embodiment.

FIG. 1 shows the composition of a picture reproducer provided with a decoding device according to an embodiment. As shown in the figure, a picture reproducer 1 is provided with a control chip 20, DRAM (Dynamic Random Access Memory) 30, ROM (Read Only Memory) 40 and LCD (Liquid Crystal Monitor) panel 50. ROM 40 stores compression data 14 generated by the coding (compressing) of the picture data (source data 10). Control chip 20 decodes the compressed data 14 stored in ROM 40 and the picture frame is generated based on the source data 10 generated by decoding the compression data; the generated picture frame is output to LCD panel 50. The DRAM 30 functions as a frame buffer to accumulate the picture frames generated by control chip 20, as the work memory to generate the picture frames by control chip 20.

Control chip 20 is provided with a CPU (Central Processing Unit) 21, GPU (Graphics Processing Unit) 22, DRAM controller 23, display controller 24, DMAC (Direct Memory Access Controller) 25, ROM controller 26 and decompression circuit 100 as the decoding device of the embodiment. CPU 21, GPU 22, DRAM controller 23, control bus 27, and sub-bus 28 are connected with main bus 29, respectively. DMAC 25 and ROM controller 26 are connected to both control bus 27 and sub-bus 28. Decompression circuit 100 is connected to both control bus 27 and DMAC 25.

ROM controller 26 is an interface circuit for control chip 20 to access ROM 40. Moreover, DRAM controller 23 is an interface circuit for control chip 20 to access DRAM 30. Moreover, display controller 24 is an interface circuit for control chip 20 to display the picture frames on LCD panel 50.

Decompression circuit 100 generates original data 10 by decoding the compressed data 14. A detailed composition of the decompression circuit 100 is described later.

CPU 21 controls the entire picture reproducer 1. DMAC 25 transmits the compressed data 14 stored in ROM 40 to the decompression circuit 100 via ROM controller 26 and sub-bus 28 under the control of CPU 21. The original data 10 generated by decoding the compressed data 14 by decompression circuit 100 is transmitted to DRAM 30 via sub-bus 28, main-bus 29 and DRAM controller 23.

GPU 22 generates a picture frame from the original data 10 stored in DRAM 30 under the control of CPU 21 and this generated picture frame is stored in the frame buffer secured in the DRAM 30. Display controller 24 outputs the picture frame stored in the frame buffer to LCD panel 50.

Figure 2:
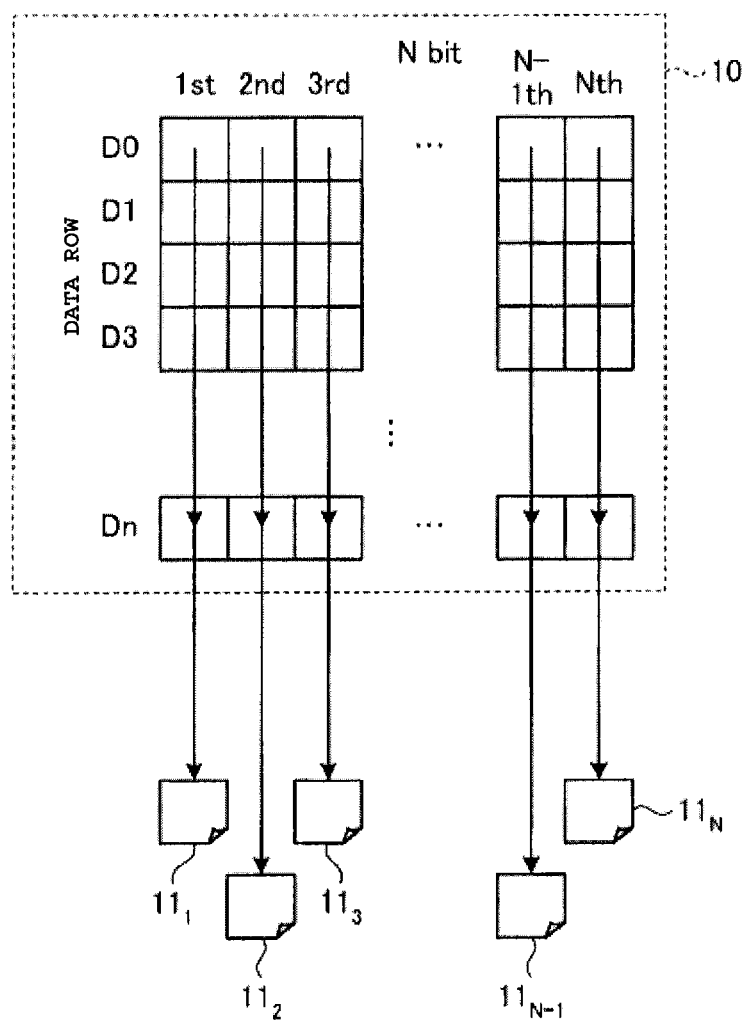
FIG. 2 schematically explains the attribute to generate decompressed data from the original data.
Figure 3:
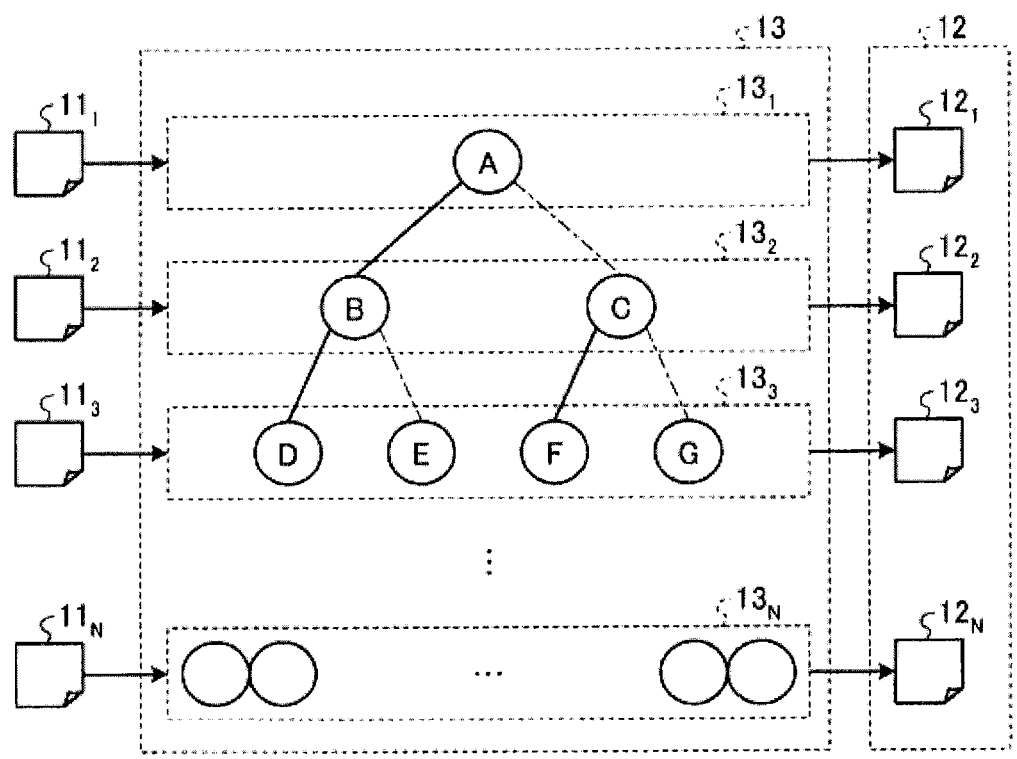
FIG. 3 schematically explains the attribute to generate decompressed data from the original data.

Here, compression data 14 is the data generated by coding the original data 10 by the coding method of the embodiment. A specific description of the coding method is given in FIG. 7 to FIG. 9. Here FIG. 2 and FIG. 3 are used to schematically explain the aspect of generating the compressed data 14 from the original data 10. Here as an example, the case is assumed wherein compressed data 14 is generated by the Binary Range Coder.

As shown in FIG. 2, source data (original data 10) used to generate the compression data 14 is composed of multiple symbols D of fixed length bits. Here, the bit length of symbol D is assumed to be N and original data 10 is composed by arranging n+1 symbols in the order of D0, D1, D2 to Dn. However, both N and n are positive integers.

Original data 10 is divided into N stream data (stream data $11_1$ to $11_N$) so that each bit of the symbol D belongs to different stream data. Individual stream data are composed by arranging the corresponding bits in symbol D in the arranging order of symbol D in the original data 10.

For example, stream data $11i$ are composed by arranging the respective ith bit in the order of symbols D0, D1, D2 to Dn. Hereafter the stream data $11_1$-$11_N$ are occasionally called stream data 11. Moreover, in some cases the stream data are simply referred to as a stream.

As shown in FIG. 3, each stream 11 generated by division is coded using different contexts respectively. The context is a probabilistic model that is based upon the occurrence probability of the input bit.

FIG. 3 shows one example of a context architecture. In this example, a context architecture 13 has a bisectional tree structure taking context A used for coding the stream $11_1$ as the root. The ith stream 11 (stream $11i$) is coded using the context of the ith layer. Where there are multiple contexts for a particular i level, (when the value of i is 2 or more) contexts connected to context used in level i−1 with a solid line or dashed line are used. When the bit that is to be coded in level i−1 is "0", context connected with a solid line is used; and when the bit that is to be coded in level i−1 is "1", context connected with a dashed line is used. Thus, context architecture 13 is provided with a layered structure that is related to multiple probabilistic models. Each level of this layered structure corresponds to a couple of N streams 11. The probabilistic model belonging to the leaf side level of this layered structure (that is context group 13 of the context group $13_N$ side) is related to the probabilistic model belonging to the root side level of this layered structure (that is context group 13 of the context group $13_1$ side) in such a way that one bit coded using the probabilistic model using this root side is specified based on the value of the other bit corresponding to the same symbol D.

The coding of a single symbol Di is explained herein with reference to FIG. 2. The first bit of symbol Di is included in stream $11_1$, and context A is used for the coding of this bit. When the concerned bit is "0", a bit of the same symbol Di in the stream $11_2$ (second bit of symbol Di) is coded using context B. When the second bit of symbol Di is "1", a bit of the same symbol Di in the stream $11_3$ (third bit of symbol Di) is coded using context E.

Thus, the context used for coding stream $11_i$ for the same symbol D is provided according to the bits that are to be coded and that are input in each stream $11_1$ to stream $11_{i-1}$. In other words, context used to code the ith bit of symbol D is decided by the value of symbol D from 1st to i−1, which are bits higher in order than the bit that is to be coded.

More than one context that belongs to the same level are called a context group. That is code data (code stream) $12_i$ is generated by coding stream $11_1$ using the contexts belonging to context group $13_i$. The code data $12_1$ to $12_N$ of N generated from N stream 11 is composed of compression data 14. The code data $12_1$ to $12_N$ can be collectively called code data 12.

Next, a decoding device of the embodiment is explained.

Figure 4:
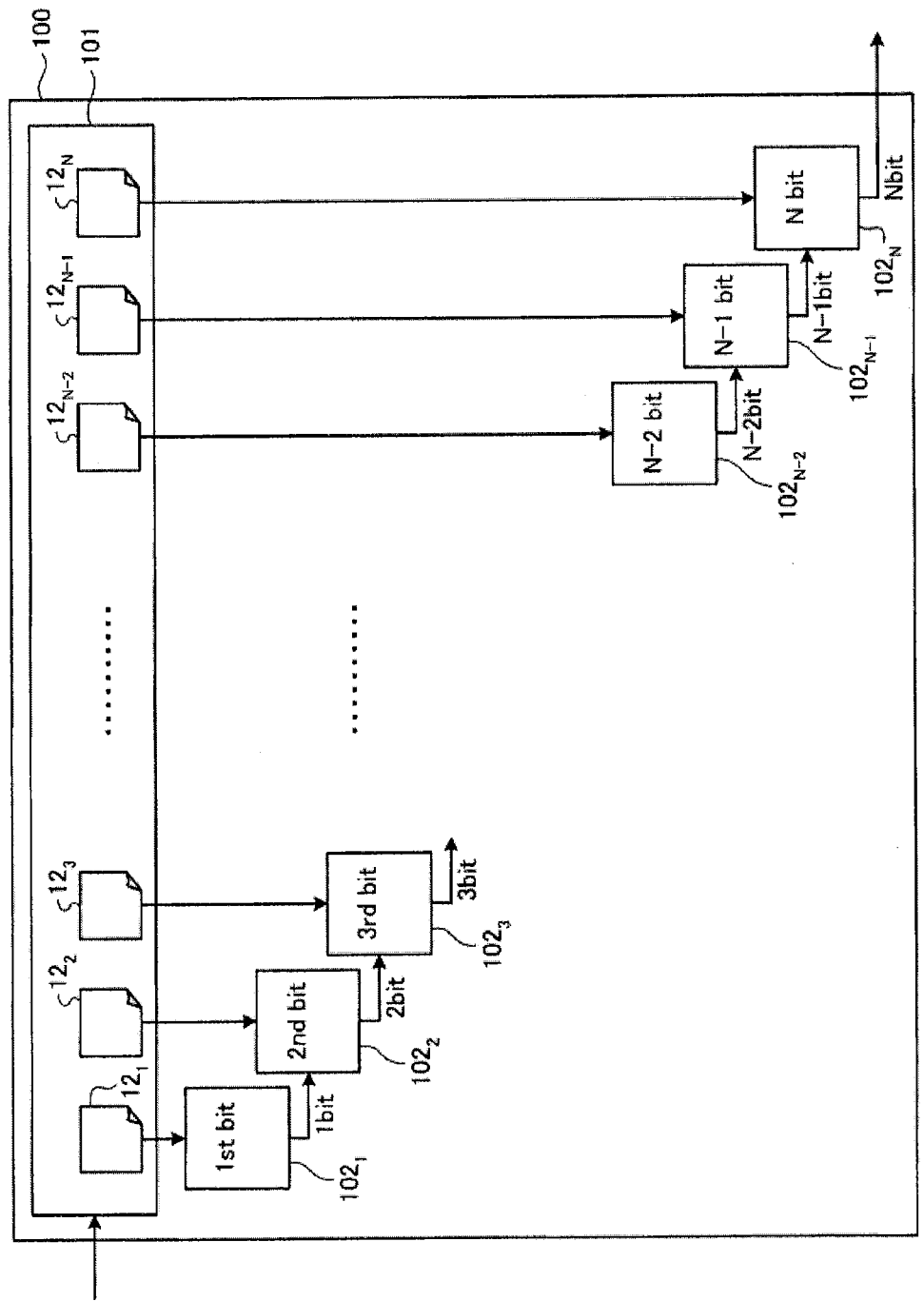
FIG. 4 explains the composition of the decompression circuit.

According to the embodiment, decompression circuit 100 can decode the compressed data 14 that is composed as described above with high speed. FIG. 4 explains the composition of decompression circuit 100.

As shown in the FIG. 4, the decompression circuit 100 is provided with a stream buffer 101 that buffers the compressed data 14 that is read by ROM 40 and transmitted by N decoders (decoder $102_1$ to $102_N$). Hereafter the decoders $102_1$ to $102_N$ are collectively referred to as decoder 102.

Decoders $102_1$ to $102_N$ are connected in a multistage series in the order corresponding to the multilayer structure of the context architecture 13. Decoder $102_i$ of i stage can carry out decoding using the context that belongs to context group $13i$. N code data $12_1$ to $12_N$ that consist of compressed data 14 are buffered in parallel in the stream buffer 101. The N decoders $102_1$ to $102_N$ decode the corresponding code data 12 among the N code data $12_1$ to $12_N$ buffered in the stream buffer 101. The bit that composes the corresponding stream 11 is sequentially generated in each unit cycle. Each of decoders 102 transmits the 1 bit generated by decoder 102 to the decoder of the later stage by uniting it with the last bit of the decoded value of same symbol D to which one bit from decoder 102 is transmitted from decoder 102 of the previous stage. Decoder $102_N$ of the N stage unites the bit obtained by decoder $102_N$ with the last bit of the value of N−1 bit that can be transmitted from the decoder $102_N$, and then the obtained N bit value is output as the decoded symbol D.

Further, the first hierarchical context group $13_1$ is excluded and the context group 13 includes a number of contexts. The decoder 102 from the 2nd stage onwards selects the context to be used from the number of contexts on the basis of decoded values which are related to the identical symbol D sent from the previous stage decoder 102.

Figure 5:
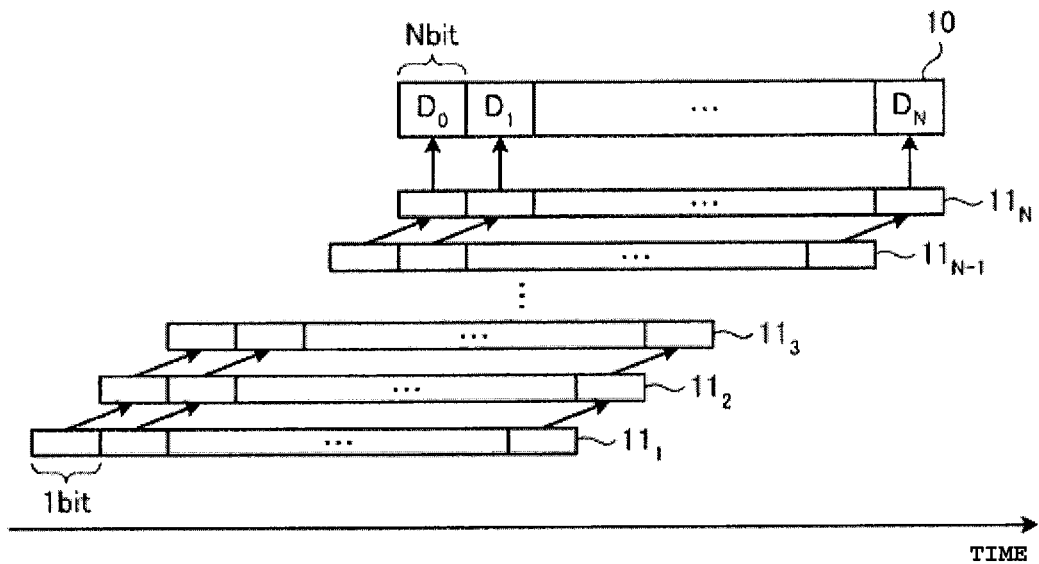
FIG. 5 explains the timing at which N decoders generate source data.

In this manner, the decoders $102_1$ to $102_N$ decode the corresponding code data 12 by pipeline processing and thus the decoding can be performed speedily as compared to the conditions wherein one decoder sequentially decodes the symbol D string of N bit. FIG. 5 explains the timing at which N decoder 102 generates the source data 10.

As shown in FIG. 5, the decoder $102_1$ outputs stream $11_1$ bit by bit by decoding the code data $12_1$. When decoder $102_1$ outputs the initial 1 bit (that means the first 1 bit of symbol D0), the decoder $102_2$ outputs the initial 1 bit (that means the second bit of symbol D0) of stream $11_2$ from code data $12_2$ on the basis of relevant output results. Decoder $102_1$ outputs the initial bit of symbol D1 in a cycle similar to the cycle used when decoder $102_2$ outputs the second bit of symbol D0.

In this way, the decoder $102_i$ from the 2nd stage onwards generates the value of 1 bit in each unit cycle and links the previously generated value of 1 bit with the value of the first i−1 bit width of symbol D which includes the values generated by the i−1 stage decoder in the former unit cycle. The decoder $102_1$ to $102_N$ can output symbol D of N bit width for each unit cycle since the value of the first i bit width of symbol D which is generated by the linkage is output. This means that decoding can be done speedily as compared to the conditions wherein one decoder serially generates the symbol D of N bit width one by one.

Figure 6:
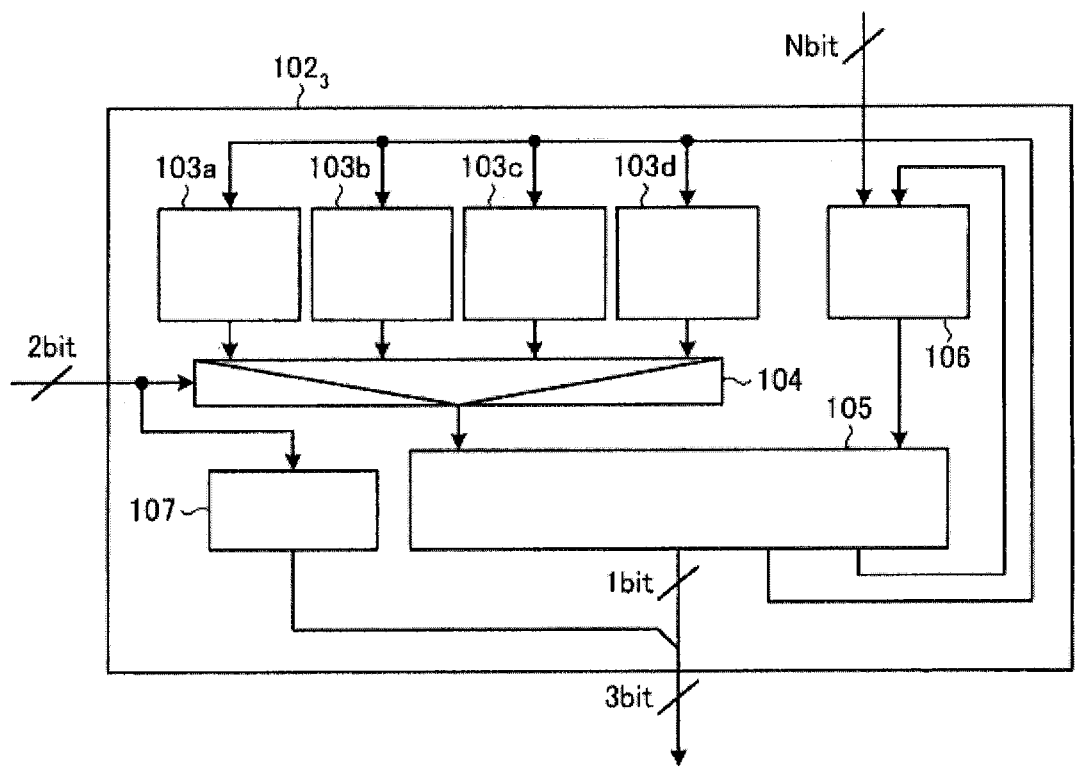
FIG. 6 explains the composition of the decoder.

FIG. 6 explains the configuration of decoder 102. Here, the configuration of decoder $102_3$ of the 3rd stage is explained as an example.

As shown in the figure, the decoder $102_3$ has 4 probability table memory units 103a to 103d, selection circuit 104, decoder core 105, code/range memory unit 106 and flip-flop 107.

The code/range memory unit 106 temporarily stores the process target data from code data $12_3$ which is fetched from stream buffer (buffer) 101 and stores the range. The probability table memory unit 103a to 103d stores the occurrence probability related to respective different contexts. Selection circuit 104 selects one memory unit out of 4 probability table memory units 103a to 103d by considering the decoding results of 2 bits that are sent from the previous stage decoder $102_2$ as selection signals. For example, as explained according to the context architecture 13 of FIG. 3, the probability table memory units 103a to 103d store occurrence probabilities related to context D, occurrence probabilities related to context E, occurrence probabilities related to context F and probabilities related to context G, respectively. Further, if the decoding result of 2 bits sent from the previous stage decoder $102_2$ is "10" then the selection circuit 104 selects the probability table memory unit 103c which stores occurrence probabilities of context F.

Further, the number of probability table memory units 103 changes depending on which number code data 12 is decoded by the decoder 102. For example, the decoder $102_2$ decoding 2nd code data $12_2$ will use 2 of probability table B and C, so probability table memory unit 103 of 2 is provided.

The decoder core 105 decodes the process target data from code data $12_3$ that is stored in code/range memory unit 106 on the basis of the occurrence probabilities stored in probability table memory unit 103 which is selected by selection circuit 104 and on the basis of range which is stored in code/range memory unit 106. The values of 1 bit obtained by decoding are linked to the end of 2 bit decoding result sent from the previous stage decoder $102_2$ and then it is sent to the later stage decoder $102_4$. The flip-flop 107 retains the 2 bit decoding result only for a short duration to adjust the output timing of the 2 bit decoding result sent from the previous stage decoder $102_2$ and the output timing of the 1 bit decoding result which was generated by the decoder $102_3$.

Next, the encoding device and encoding method mentioned in the embodiment is explained.

Figure 7:
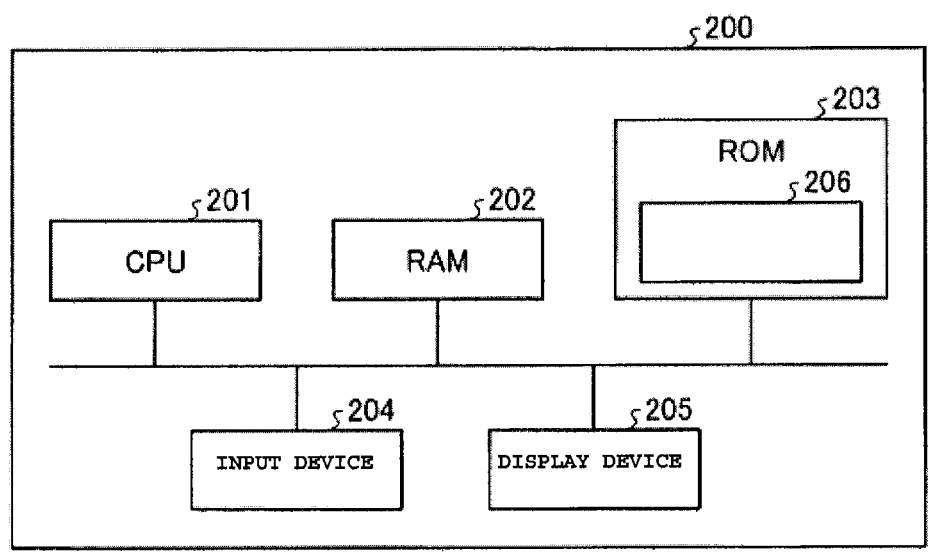
FIG. 7 shows a hardware composition example when the decoding device is implemented using a computer.

Further, the compressed data 14 are generated by running an exclusive program on the computer. FIG. 7 shows a hardware configuration example at the time of operating the encoding device using a computer wherein the compressed data 14 are generated.

As shown in FIG. 7, encoding device 200 has CPU 201, RAM 202, ROM 203, input device 204, and display device 205. CPU 201, RAM 202, ROM 203, input device 204, display device 205 are respectively connected through a bus line.

Display device 205 can display the information of the LCD monitor, etc. The display device 205 displays the output information for the user. Input device 204 consists of a mouse and key board. This input device 204 is used by the user for entering operation information which is related to encoding device 200. The entered operation information is sent to CPU 201.

ROM 203 is a storage medium which records the encoding program 206, being the computer program for performing the encoding method mentioned in the embodiment. From ROM 203, CPU 201 reads the encoding program 206 through bus line, loads it on RAM 202, and then runs the encoding program 206 which was loaded in RAM 202. Source data 10 enters through ROM 203 and external storage device which is not shown in the figure. CPU 201 generates the compressed data 14 by carrying out a process, which is described later, on the basis of encoding program 206 loaded in RAM 202 as against the entered source data 10. CPU 201 outputs the generated compressed data 14 to RAM 202 and external storage device.

Further, the encoding program 206 can be configured in such a way that it can be provided or circulated through the network such as internet. Instead of ROM 203, the concrete medium but not the temporary medium such as external storage device, removable memory device, and optical disk device can be used as storage medium where encoding program 206 can be loaded.

Figure 8:
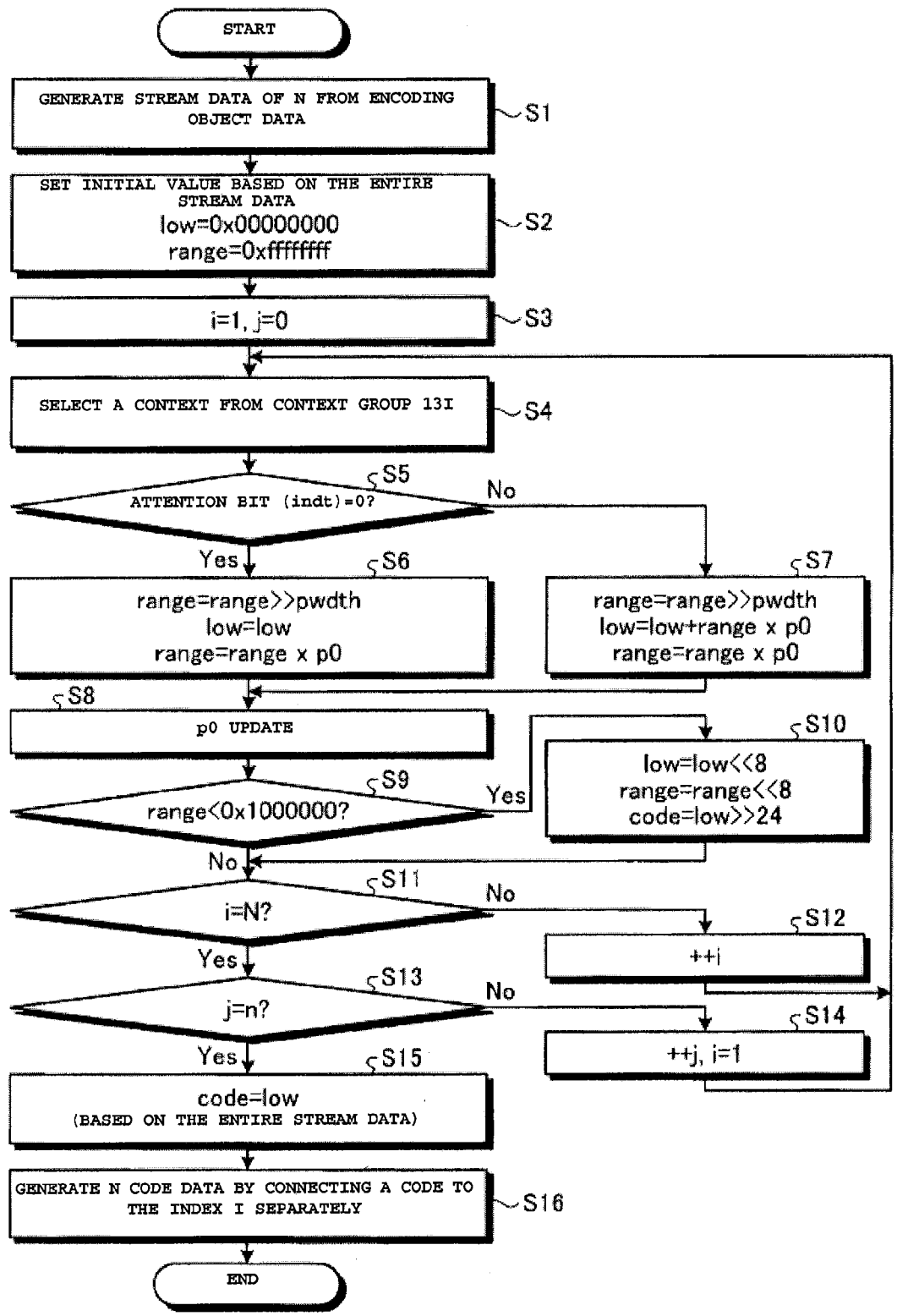
FIG. 8 is a flowchart that explains a coding method according to an embodiment.
Figure 9:
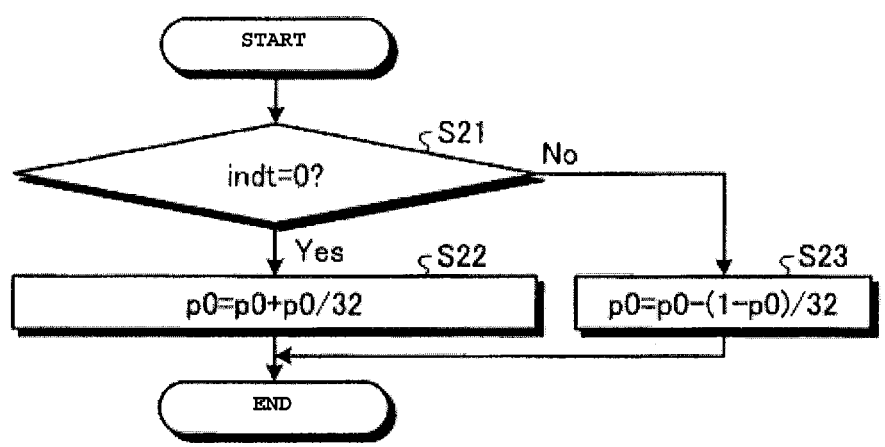
FIG. 9 is a flowchart that explains the update process of the occurrence probability executed in the decoding device.

Further, the encoding method mentioned in the embodiment is explained by using FIG. 8 and FIG. 9. The relevant encoding method is executed under control of encoding program 206 through CPU 201 which exists in encoding device 200. Below, CPU 201 is explained as an operating agent of the relevant encoding method.

FIG. 8 is a flow chart that explains the encoding method according to an embodiment, which is executed by encoding device 200. CPU 201 divides the source data 10 and generates N stream $11_1$ to $11_N$ (Step S1). Then CPU 201 initializes 'low' and 'range' which is used for encoding stream $11_1$ to $11_N$ (Step S2). Here, CPU 201 initializes 'low' and 'range' as shown in the following formula $$low = 0x00000000 \qquad \text{formula (1)}$$

$$range = 0xffffffff \qquad \text{formula (2)}$$

Further, low and range are provided for each stream 11. The respective values of each stream 11 are stored in RAM 202.

CPU 201 executes the processing of Step S4 to Step S10 using the bit belonging to the symbol Dj among the bit string included in stream $11_i$ as an attention bit (indt) and i, j as a loop index. For this, CPU 201 first of all initializes loop index i, j as per below (Step S3).

$$i = 1 \qquad \text{Formula (3)}$$

$$j = 0 \qquad \text{Formula (4)}$$

Next, CPU 201 selects one context from context group $13_i$ (Step S4). When the i=1 condition is satisfied in Step S4, CPU 201 selects context A. When the i>=2 condition is satisfied, CPU 201 selects one context among the multiple contexts on the basis of the value from the first value of symbol Dj to the i−1st value. In the context selected in Step S4, occurrence probability p0 of value "0" is supported and occurrence probability p0 corresponding to the relevant context is used in the processes from S5 to S8. Further, occurrence probability p0 is expressed by the number of bits (pwdth) decided in advance; pwdth is common among the contexts.

Next, CPU 201 determines whether the indt=0 condition is satisfied or not (Step S5). When the indt=0 condition is satisfied (Step S5, Yes), CPU 20 shifts the 'range' associated with index i to the right side only by the number of expression bits (pwdth) of p0 and updates the 'range' with the value obtained by multiplying p0 by the shifted range (Step S6). On the other hand, when the indt=1 condition is satisfied (Step S5, No), CPU 201 shifts the range associated with index i to the right side only by pwdth and updates the 'range' with the value obtained by multiplying p0 by the shifted range. Further, it updates 'low' by the value which is obtained by adding the updated range in 'low' which is associated with index i (Step S7).

After processing Step S6 or Step S7, CPU 201 executes the update process of p0 (Step S8); p0 updated in Step S8 represents the occurrence probability p0 associated with the context selected in Step S4.

FIG. 9 is a flowchart wherein the update process of the occurrence probability p0 executed in Step S8 is explained. First of all, CPU 201 decides whether the indt=0 condition is satisfied or not (Step S21). When the indt=0 condition is satisfied (Step S21, Yes), CPU 201 adds the value which is obtained by dividing the p0 value by "32" in p0 and updates p0 by the obtained value (Step S22). On the other hand, when the indt=1 condition is not satisfied (Step S21, No) CPU 20 subtracts p0 from value "1" and divides the obtained value by the value "32". Then, it subtracts the value obtained by the division from p0 and updates p0 by the obtained value (Step S23). CPU 201 completes the update process of p0 by the process of Step S22 or Step S23.

CPU 201 executes the process of Step S8 and decides whether the 'range <0x1000000' condition is satisfied or not (Stage 9). When the 'range <0x1000000' condition is satisfied (Step S9, Yes), CPU 201 shifts 'low' to the left only by 8 bits and updates 'low' by the obtained value. Further, it shifts 'range' to the left only by 8 bits and updates 'range' by the obtained value. It shifts 'low' after update to the right only by 24 bits and outputs the obtained value as a part (code) of code data 12$i$ (Step S10). When the range <0x1000000 condition is not satisfied (Step S9, No), the process of Step S10 is skipped.

Next, CPU 201 decides whether the i=N condition is satisfied or not (Step S11). When the i=N condition is not satisfied (Step S11, No), CPU 201 increments i only by "1" (Step S12) and executes the process in Step S4.

When the i=N condition is satisfied (Step S11, Yes), CPU 201 decides whether the j=n condition is satisfied (Step S13). When j=n is not satisfied (Step S13, No), CPU 201 increments j only by "1", initializes i by "1" (Step S14) and executes the process in Step S4.

When the j=n condition is satisfied (Step S13, Yes), CPU 201 outputs 'low' for the entire stream $11_1$ to $11_N$ as the remaining code data $12_1$ to $12_N$ (Step S15). Also, CPU 201 connects one or more codes output in Step S10 and the code output in Step S15 to the loop index and generates each of code data $12_1$ to $12_N$ (Step S16) and completes the operation.

Figure 10:
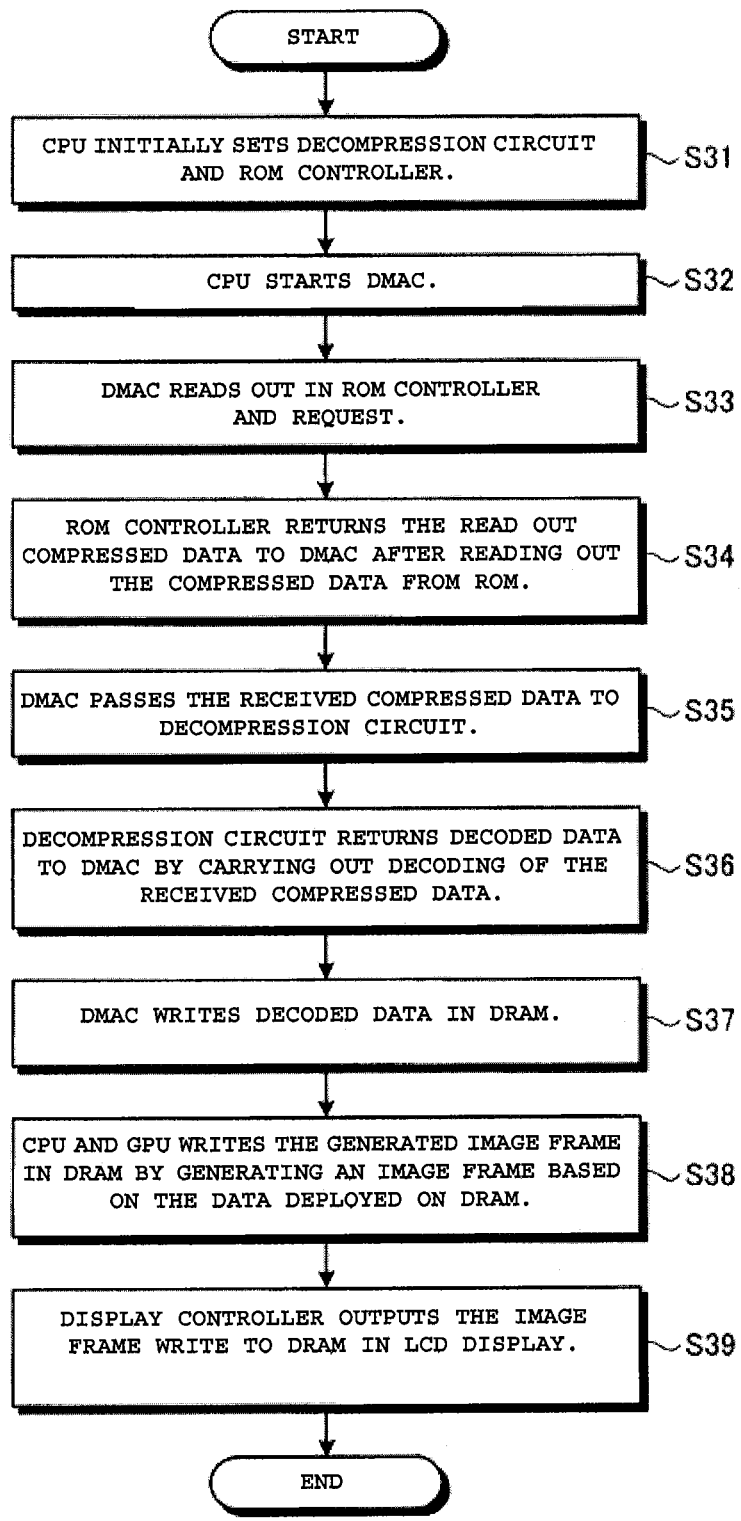
FIG. 10 is a flowchart that explains the operation of a picture reproducer.
Figure 11:
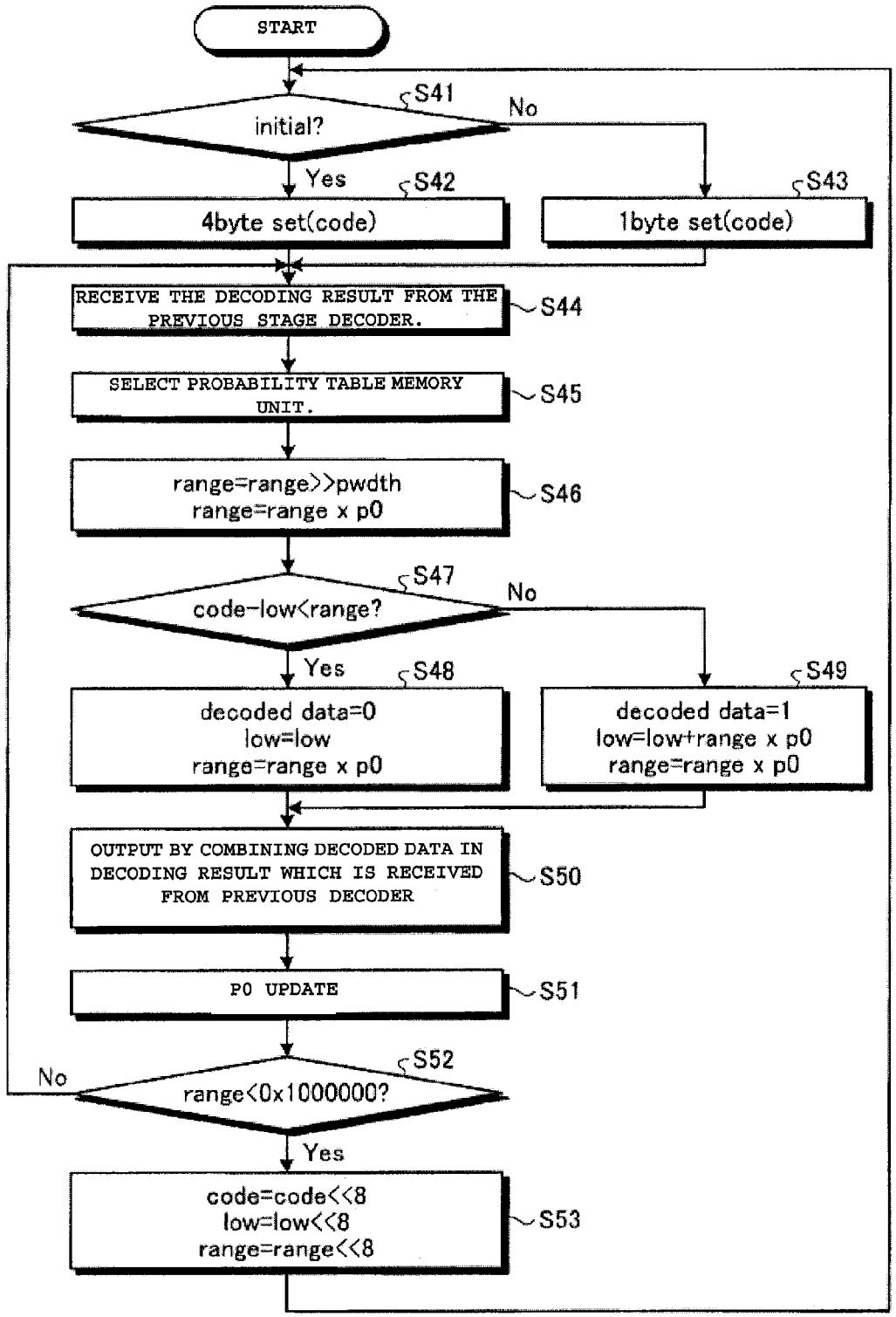
FIG. 11 is a flowchart that explains the operation of decoding one code data by one decoder.
Figure 12:
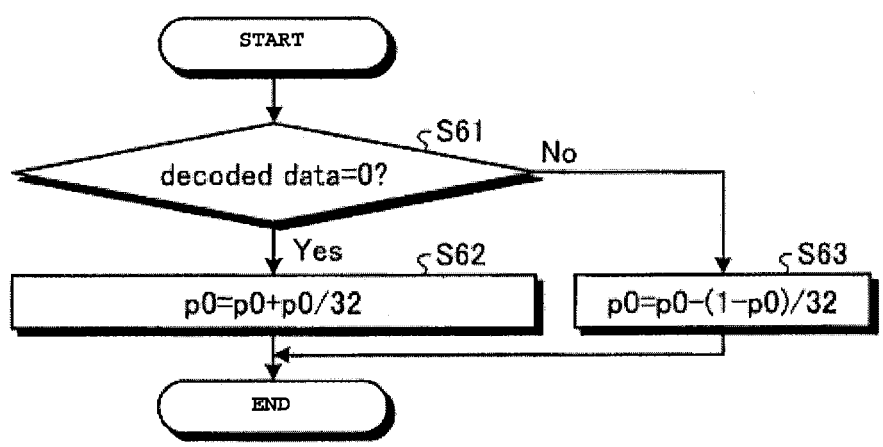
FIG. 12 is a flowchart that explains the update process of the occurrence probability executed with the decoder core.

Next, the decoding method of the embodiment is explained on the basis of FIG. 10 to FIG. 12. FIG. 10 is a flowchart wherein the operation of picture reproducer 1 shown in FIG. 1 is explained.

As shown in FIG. 10, first of all, CPU 21 executes the initialization of decompression circuit 100 as well as ROM controller 26 via control bus 27 (Step S31). Then, CPU 21 starts DMAC 25 through control bus 27 (Step S32). DMAC 25 issues the reading request of compression data 14 in ROM controller 26 through sub bus 28 (Step S33). Rom controller 26 receiving reading request reads the compression data 14 from ROM 40 and returns read compression data 14 to DMAC 25 (Step S34). DMAC 25 passes received compression data 14 to decompression circuit 100 (Step S35). Decompression circuit 100 performs decoding of received compression data 14 and returns source data 10 obtained by decoding to DMAC 25 (Step S36). DMAC 25 writes source data 10 which was received after decoding on DRAM 30 through sub-bus 28, main bus 29 and DRAM controller 23 (Step S37). CPU 21 as well as GPU 22 work in coordination and generate image frames from source data 10 which was written on DRAM 30 and store the generated image frame in frame buffer reserved for DRAM 30 (Step S38). Display controller 24 reads the image frame from the frame buffer, outputs the read image frame to LCD panel 50 (Step S39), and completes the operation of the picture reproducer 1.

When decompression circuit 100 performs the decoding of compression data 14 in the process of Step S36, each decoder $102_1$ to $102_N$ performs the decoding of corresponding code data 12 by the pipeline process. FIG. 11 is a flowchart wherein the decoding operation of one code data 12 by one decoder 102 shown in FIG. 6 is explained.

As shown in FIG. 11, decoder core 105 first decides whether self decompression circuit 100 is in the initial condition (Step S41). Initial condition indicates the condition before starting the decoding after performing initialization by CPU 21 according to the process of Step S31. Further, for initial conditions, initialized 'range' as well as 'low' is stored in code/range memory unit 106 using formula (1) as well as formula (2).

When decompression circuit 100 is in the initial condition (Step S41, Yes), decoder core 105 extracts the first 4 bytes of code data corresponding to decoder 102 among the code data $12_1$ to $12_N$ included in compressed data 14 that has been sent to stream buffer 101. Then, it sets the data of extracted 4 bytes in the code/range memory unit 106 (Step S42). Decoder core 105 uses the data set in the code/range memory unit 106 according to the process of Step S42 as a variable "code" in the post process. When decompression circuit 100 is not in the initial condition (Step S41, No), decoder core 105 extracts 1 byte data from corresponding code data stored in stream buffer 101 and sets the data of the extracted 1 byte to the lowest 1 byte of the value consisting of the code which is already stored in code/range memory unit 106 (Step S43).

After executing the process of Step S42 or Step S43, decoder 102 receives decoding results from previous decoder 102 (Step S44). Selection circuit 104 uses the received decoding result as a selection signal and selects one probability table memory unit among multiple probability table memory units 103 (Step S45). Multiple probability table memory units 103 store occurrence probability p0 of "0" in the memory respectively. Probability table memory units 103 selected in Step S45 input p0 stored in the memory by self memory unit 103 to decoder core 105 through selection circuit 104. Further, the decoding result sent from the previous decoder 102 is latched in flip flop 107.

Next, decoder core 105 shifts the 'range' to the right only by pwdth and updates the 'range' by the value obtained by adding p0 in the shifted 'range' (Step S46).

Furthermore, decoder core 105 decides whether the 'code-low<range' condition is satisfied (Step S47). When 'code-low<range' condition is satisfied (Step S47, Yes), decoder core 105 considers decoded data associated with decoder 102 as "0" and updates 'range' by the value which is obtained by adding p0 to 'range' (Step S48). Decoder 102 links the decoded data to the lowest bit side of decoded data which is latched in flip flop 107 and outputs multiple bits of decoded data obtained by linking (Step S50).

When code-low<range is not satisfied, (Step S47, No), decoder core 105 assumes decoded data=1 and updates 'range' in the value derived by multiplying 'range' by p0 and along with that it updates 'low' in the value obtained by adding 'range' after updating, in 'low' (Step S49). After the process of Step S49, decoder 102 carries out the process of Step S50.

After the process of Step S50, decoder core 105 carries out the update process of p0 stored in probability table memory unit 103 selected by Step S45 (Step S51).

FIG. 12 is a flowchart explaining the update process of the occurrence probability p0 carried out in Step S51. First, decoder core 105 judges whether the decoded data=0 condition is satisfied (Step S61). When the decoded data=0 condition is satisfied, (Step S61, Yes), decoder core 105 adds the value obtained by dividing p0 value by 32 and updates p0 by the value obtained (Step S62). On the other hand, when the decoded data=1 condition is not satisfied, (Step S61, No), decoder core 105 divides the value obtained by subtracting p0 from value "1" by the value "32" and it subtracts the value obtained by the division from p0 and updates p0 by the obtained value (Step S63). Decoder core 105 completes the update process of p0 by the process of Step S62 or Step S63.

After the process of stage 51, decoder core 105 judges whether the range <0x1000000 condition is satisfied (Step S52). When the range <0x1000000 condition is satisfied (Step S52, Yes), decoder core 105 updates 'code' by the value that is obtained by shifting 'code' to the left by only 8 bits, updates 'low' by the value that is obtained by shifting 'low' to the left by only 8 bits, and updates 'range' by the value that is obtained by shifting 'range' to the left by only 8 bits (Step S53). After the process of Step S53, decoder core 105 carries out the process of Step S41. When the range <0x1000000 condition is not satisfied, (Step S52, No), the process of Step S44 should be carried out.

In such a way, one decoder 102 connects 1 bit decoder data obtained by decoder 102 after decoding to the bit string which includes part of symbol D entered by the previous decoder 102. With this, N decoder $102_1$ to $102_N$ can in coordination continuously generate symbol D which includes source data 10 after decoding N code data $12_1$ to $12_N$ by the pipeline process. Generated symbol D is stored in sequential DRAM 30 by the process of Step S36 to Step S37 and source data 10 is restored in DRAM 30.

Further, the embodiment explains context architecture 13 which is used in encoding/decoding as having a binary tree structure but context architecture 13 which is applicable to the embodiment is not limited to this. Context architecture 13 is applicable only when it satisfies the following two cases:

(1) When context architecture describes the correspondence relationship among the multiple contexts by the hierarchical structure of the N hierarchy which, one to one, corresponds to N stream $11_1$ to $11_N$.

(2) When the value of stream $11_j$ of hierarchy j (but j>i) does not have any effect on the selection of hierarchy i (i is 1 to N).

Figure 13:
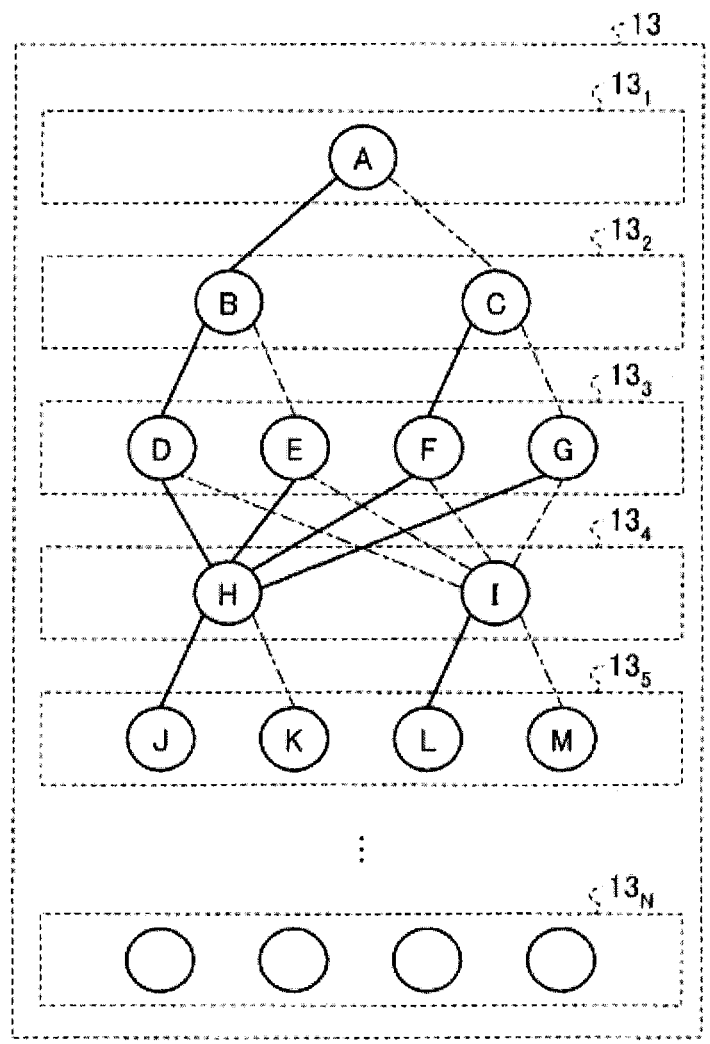
FIG. 13 shows one example of a context architecture according to an embodiment.

FIG. 13 is a diagram showing another example of a context architecture according to an embodiment. In this example, context architecture 13 forms a binary branching structure for multiple contexts pertaining to 1st stage context group $13_1$ to 3rd stage context group $13_3$. 4th stage context group $13_4$ has 2 contexts (context H and context I). Context H is commonly connected to the solid line from each 3rd stage context D to G and context I is commonly connected to the dashed line from each context D to G. 5th context group $13_5$ has 4 contexts (contexts J to M). Context J is connected to context H by a solid line and context K is connected to context H by a dashed line. Context L is connected to context I by a solid line and context M is connected to context I by a dashed line.

Further, context architecture having a binary tree structure that is the same as that of context architecture 13 shown in the example of FIG. 3 is adopted; the number of probability table memory units 103 present in decompression circuit 100 is increased depending on the number of N. Similar to context architecture 13 shown in FIG. 13, compared to the case wherein a binary tree structure is adopted, the number of required probability table memory units 103 can be reduced by reducing the number of contexts.

Further, the hierarchy order may not always match the sequence of each bit which includes symbol D. For example, the number 3 bit of symbol D can be encoded by using context group $13_1$ of the top stage.

Moreover, in the embodiment example in which 'binary range coder' is adopted as a code for encoding and decoding is explained and in the unit for encoding/decoding, it is possible to adopt other codes such as algebraic signs other than 'binary Range Coder'.

Moreover, it is explained that each of the streams 11 is generated from each bit which includes symbol D, but symbol D is composed by fixed length N×M bits and each stream 11 is generated per unit data (partial symbol) of M bit width. At that time, each decoder 102 generates a partial symbol of M bit width per unit cycle.

As stated above, according to the embodiment, decompression circuit 100 includes a stream buffer 101 that stores N code data $12_1$ to $12_N$ in the memory and N decoders $102_1$ to $102_N$ that are connected in multistages and in series, show a one-to-one correspondence with N code data $12_1$ to $12_N$, and sequentially generates partial symbols of M bit width per unit cycle after decoding each corresponding code data 12. Decoder $12_i$ of i (i>=2) stage of N decoder $102_1$ to $102_N$ stores multiple probabilistic models in memory; receives the input of the partial symbol of i−1 which include partial symbols generated by decoder $102_{i-1}$ of i−1 in the preceding unit cycle for each unit cycle, and selects one out of multiple probabilistic models based on i−1 partial symbols which are input, then creates one partial symbol using selected probabilistic models. It outputs the generated one partial symbol along with the partial symbol of i−1 which was input previously. Therefore, N decoder $102_1$ to $102_N$ can in coordination generate unit symbols per unit cycle and thus one decoder can speedily encode compared to the case in which one unit symbol is generated. That is, decompression circuit 100 can perform the decoding of codes as fast as possible.

Moreover, decoder $12_i$ of i stage is structured in such a way that it connects one partial symbol generated by decoder $12_i$ to the end of i−1 partial symbols which are previously input, and outputs it. Therefore, N decoders $102_1$ to $102_N$ can in coordination sequentially decode partial symbols from the starting of symbol D.

Moreover, each of N decoders $102_1$ to $102_N$ is structured in such a way that it updates previously selected probabilistic models on the basis of one partial symbol generated by decoder 102. Therefore, it can handle compression data 14 at a high-compression-ratio compared to the case in which probabilistic models are set.

Moreover, N code data 12 are data generated by encoding per each partial symbol source data 10 composed by arranging symbol D consisting of N partial symbols in multiples and code data 12i which ranges from the starting of symbol D to i partial symbol and corresponds to I stage decoder among N decoders, and it represents data which is encoded using probabilistic models set on the basis of the starting of symbol D to the i−1 partial symbol among multiple probabilistic models provided with previous decoder $102_i$ of the i stage. Therefore, N decoder $102_1$ to $102_N$ can, in coordination, sequentially decode partial symbols from the starting of symbol D.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without depart-

What is claimed is:

1. A decoding device comprising:
   a buffer configured in memory to store N (N is a positive integer) code streams; and
   N decoders connected in series, each of the N decoders having a one-to-one correspondence with one of the N code streams, and being configured to decode the corresponding code stream and sequentially generate partial symbols of M bit width (M is a positive integer) per each unit cycle,
   wherein among the N decoders, i (2<=i<=N, i is a positive integer) stage decoders store multiple probabilistic models in the memory; and
   wherein, in each unit cycle, an i stage decoder receives an input of i−1 partial symbols which are partial symbols generated by an i−1 stage decoder in the former unit cycle, selects one probabilistic model among the multiple probabilistic models based on i−1 partial symbols which are entered previously, generates one partial symbol using previously selected probabilistic models, and outputs the previously generated one partial symbol along with the previously entered i−1 partial symbols.

2. The decoding device according to claim 1, wherein the i stage decoder connects the one partial symbol to the end of the i−1 partial symbols which are input.

3. The decoding device according to claim 2, wherein the i stage decoder updates selected probabilistic models per unit cycle and on the basis of one partial symbol.

4. The decoding device according to claim 3, wherein each of the N code streams is data generated by every partially symbol coding source data which is structured by arranging unit symbols consisting of N partial symbols in multiples, and
   a N code stream corresponding to the i stage decoder ranges from a top symbol of the unit symbols to i−1 of the partial symbol and comprise data that are decoded using probabilistic models set on the basis partial symbols from the top symbol of the unit symbols to i−1 among the multiple probabilistic models having the i stage decoder.

5. The decoding device according to claim 4, wherein
   a first stage decoder among the N decoders generates the partial symbols using the predetermined probabilistic models which differ from the probabilistic models stored in a second stage and higher stages in the memory, and outputs the generated partial symbols.

6. A coding method implemented by a processing unit of a computing device, comprising:
   encoding stages in which one of N code streams is generated by encoding multiple unit symbols each having an N×M bit width (N, M both are positive integers) in such a way that i (1<=i<=N) partial symbol from a top symbol of unit symbols pertains to the i code stream; wherein
   the step of encoding is performed by the processing unit;
   at the time of encoding one partial symbol, in which a hierarchical structure of N-level hierarchy which connects multiple probabilistic models and each hierarchy of the relevant hierarchical structure corresponds one-to-one to each of the N code streams;
   one of the stages is a specific stage which specifies one of the multiple probabilistic models on the basis of the hierarchical structure connected in such a way that probabilistic models which pertain to a leaf side of the relevant hierarchical structure is specified on the basis of the value of the other corresponding partial symbol which pertain to a unit symbol which is similar to one partial symbol encoded using probabilistic models pertaining to the lateral side hierarchy and probabilistic models pertaining to the relevant lateral side; and
   the step of encoding includes a separate encoding step in which the previous partial symbol is encoded using previously specified probabilistic models.

* * * * *